(12) United States Patent
Aoshima

(10) Patent No.: US 8,654,412 B2
(45) Date of Patent: Feb. 18, 2014

(54) COMPONENT IMAGING METHOD, COMPONENT IMAGING DEVICE, AND COMPONENT MOUNTING DEVICE HAVING COMPONENT IMAGING DEVICE

(75) Inventor: Yasuaki Aoshima, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 62 days.

(21) Appl. No.: 13/492,503

(22) Filed: Jun. 8, 2012

(65) Prior Publication Data

US 2012/0314265 A1 Dec. 13, 2012

(30) Foreign Application Priority Data

Jun. 9, 2011 (JP) ................................. 2011-129143

(51) Int. Cl.
*H04N 1/04* (2006.01)

(52) U.S. Cl.
USPC ........... 358/474; 358/475; 358/509; 382/275; 382/147

(58) Field of Classification Search
USPC ................. 358/474, 475, 509, 497, 496, 486; 382/275, 147, 141, 145
See application file for complete search history.

(56) References Cited

U.S. PATENT DOCUMENTS

| | | | | |
|---|---|---|---|---|
| 5,454,049 A * | 9/1995 | Oki et al. | ...................... | 382/172 |
| 5,610,652 A * | 3/1997 | Suzuki | .......................... | 347/256 |
| 6,546,126 B1 * | 4/2003 | Wittmann et al. | ............ | 382/147 |
| 6,633,415 B1 * | 10/2003 | Arafune et al. | ............... | 358/474 |
| 7,113,619 B1 * | 9/2006 | Matama | ........................ | 382/112 |
| 8,304,705 B2 * | 11/2012 | Chang et al. | .................. | 250/205 |
| 8,345,327 B2 * | 1/2013 | Mikami | ........................ | 358/475 |
| 8,466,946 B2 * | 6/2013 | Hasebe | ......................... | 347/236 |
| 8,488,219 B2 * | 7/2013 | Mikami | ........................ | 358/475 |

FOREIGN PATENT DOCUMENTS

| | | |
|---|---|---|
| DE | 197 27 471 C1 | 12/1998 |
| JP | 2005-107716 A | 4/2005 |
| JP | 4381764 B2 | 12/2009 |
| WO | 00/26640 A1 | 5/2000 |
| WO | 2005/031642 A1 | 4/2005 |

OTHER PUBLICATIONS

The extended European Search Report dated Sep. 6, 2012; EP Application No. 12004309.6-1228.

* cited by examiner

*Primary Examiner* — Negussie Worku
(74) *Attorney, Agent, or Firm* — Studebaker & Brackett PC

(57) ABSTRACT

A component imaging method includes: an imaging preparation step of obtaining, for each of the plurality of components, an optimum lighting intensity; a component imaging step of using a line sensor and a lighting device, to integrally move the components relative to this line sensor, with the components being aligned in a main scanning direction of the line sensor, and to acquire images of the components while switching a lighting intensity of the lighting device sequentially to the optimum lighting intensity of each of the components for each imaging line; and an image processing step of compensating a line image, which is imaged at a lighting intensity other than the optimum lighting intensities, on the basis of a ratio of the lighting intensity at which the line image is obtained and the optimum lighting intensity of each of the components of the obtained component images, for the component image.

8 Claims, 8 Drawing Sheets

FIG.8

| LINE | ① | ② | ③ | ④ | ⑤ |
|---|---|---|---|---|---|
| INTENSITY | 4 | 6 | 4 | 6 | 4 |
| COMPONENT 1 | NONE | COMPENSATION REDUCED | NONE | COMPENSATION REDUCED | NONE |
| COMPONENT 2 | COMPENSATION INCREASED | NONE | COMPENSATION INCREASED | NONE | COMPENSATION INCREASED |

FIG.9

| | | | |
|---|---|---|---|
| LINE ① | 51 | 52 | 53 |
| LINE ② | | SATURATED | |
| LINE ③ | 61 | 62 | 63 |

COMPONENT IMAGING METHOD, COMPONENT IMAGING DEVICE, AND COMPONENT MOUNTING DEVICE HAVING COMPONENT IMAGING DEVICE

BACKGROUND OF THE INVENTION

1. Field of the Invention

The present invention relates to a component imaging method for imaging a component held in a component transfer head, a component imaging device, and a component mounting device having the component imaging device.

2. Description of the Related Art

There has conventionally been known a component mounting device that uses a mounting head to remove a component from a component feeder and mount the component on a loading point of a board. The component mounting device has a component imaging device, which captures an image of the component held in the mounting head before mounting the component on the board, and recognizes the state in which the component is held by the mounting head, to correct the loading position and the like of the component.

Japanese Patent Publication No. 4381764 (referred to as "patent literature" hereinafter), for example, discloses this type of component mounting device. The component mounting device of this patent literature includes a component imaging device having a line sensor and a plurality of lighting parts, wherein any of the lighting parts illuminates a component, with the component being moved at constant speed in a sub-scanning direction of the line sensor relative thereto. At this moment, for a specific component, an image thereof is imported by alternately using two of the lighting parts with different lighting conditions (lighting directions), with the component being moved at half the speed for moving the other components. This process can acquire an image that has double line images with the different lighting conditions that are lined up alternately. Then, when the line images with the same lighting condition are extracted from this image and synthesized, two component images with different lighting conditions can be acquired simultaneously by allowing the component pass once with respect to the line sensor.

The component mounting device disclosed in this patent literature is loaded in a head unit with a plurality of mounting heads arranged in a line. The head unit of the component mounting device holds a plurality of components at once and conveys the components from the component feeder to the board to efficiently mount the components onto the board. Furthermore, when recognizing the components, the component imaging device continuously captures images of the components by sequentially moving the components, held in the respective mounting heads, in the sub-scanning direction of the line sensor with respect to the line sensor as the head unit moves.

However, in addition to the component mounting device disclosed in this patent literature that has a plurality mounting head arranged in a line as described above, a component mounting device that has a plurality of mounting heads arranged in two lines has been proposed in recent years.

In the component mounting device having mounting heads arranged in two lines, two component images held in adjacent mounting heads are included in the same line image. For this reason, when optimum lighting intensities of these components are different from each other, it is difficult to acquire a component image of either one of the components at its optimum lighting intensity. In order to avoid this difficulty, the components can be run a number of times with respect to the line sensor while switching the lighting intensity of the lighting parts, but the component cannot be recognized efficiently.

The technology disclosed in the patent literature can be employed in order to solve such problems. In other words, an image on which line images of different lighting intensities are arranged alternately is acquired by alternately changing the lighting intensities to capture images of the both components while imaging the same line twice, and the line images with the same lighting intensity are extracted individually from this image and synthesized. This can simultaneously acquire two component images having different lighting intensities, by simply allowing the component to pass with respect to the line sensor once.

However, this method needs to obtain double line images in order to obtain two images having different lighting intensities, requiring twice as long to image the same line twice. Therefore, this method is not always adequate in terms of efficiently recognizing the component, and therefore has room for improvement.

SUMMARY OF THE INVENTION

The present invention was contrived in view of the circumstances described above, and an object thereof is to provide a technology for efficiently capturing images of a plurality of components having different optimum lighting intensities, and to provide a technology capable of efficiently mounting the components on a board by using this technology.

A component imaging method according to one aspect of the present invention is a component imaging method for simultaneously imaging a plurality of components that have different optimum lighting intensities for component imaging, the component imaging method comprising: an imaging preparation step of obtaining, for each of the plurality of components, an optimum lighting intensity at which a component image, eligible for component recognition, can be obtained; a component imaging step of using a line sensor that image a line image at a predetermined timing and output the obtained line image as an image for each imaging line and a lighting device, to integrally move the plurality of components in a sub-scanning direction of the line sensor relative to this line sensor, with the plurality of components being aligned in a main scanning direction of the line sensor, and to acquire images of the plurality of components while switching a lighting intensity of the lighting device sequentially to the optimum lighting intensity of each of the components for each imaging line during the relative movement; and an image processing step of compensating a line image, which is imaged at a lighting intensity other than the optimum lighting intensities, on the basis of a ratio of the lighting intensity at which the line image is obtained and the optimum lighting intensity of each of the plurality of components of the obtained component images, for the component image of each of the plurality of components.

BRIEF DESCRIPTION OF THE DRAWINGS

FIG. 8 is an explanatory diagram for illustrating a compensating process for compensating the component images by means of an image processor; and FIG. 9 is an explanatory diagram for illustrating a method of a saturated pixel image compensating process performed by the image processor (a saturated pixel completing part).

DETAILED DESCRIPTION OF THE PREFERRED EMBODIMENTS

Preferred embodiments of the present invention are described hereinafter in detail with reference to the drawings.

Figure 1:
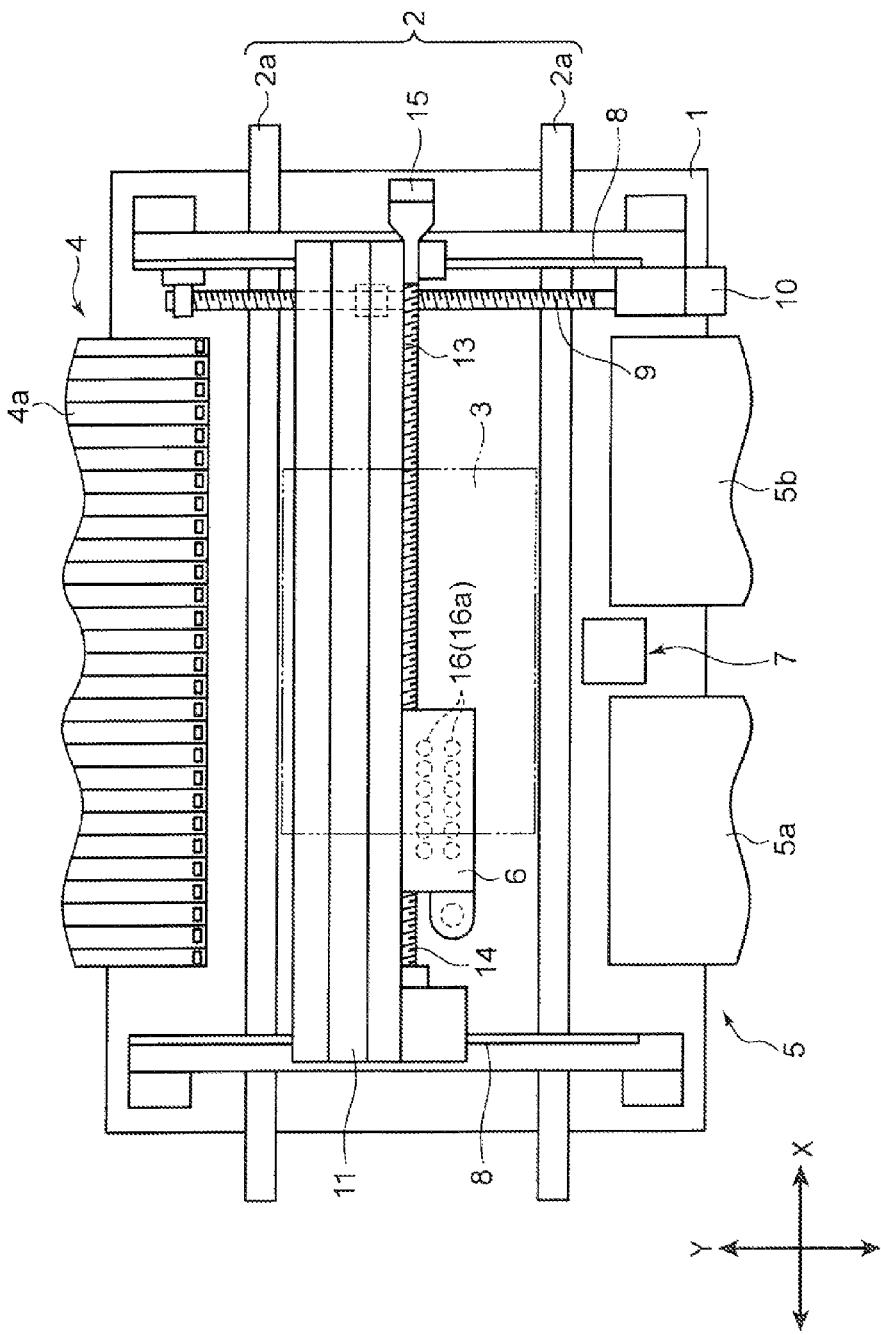
FIG. 1 is a plan view schematically showing a component mounting device (a component mounting device having a component imaging device of the present invention) according to the present invention.
Figure 2:
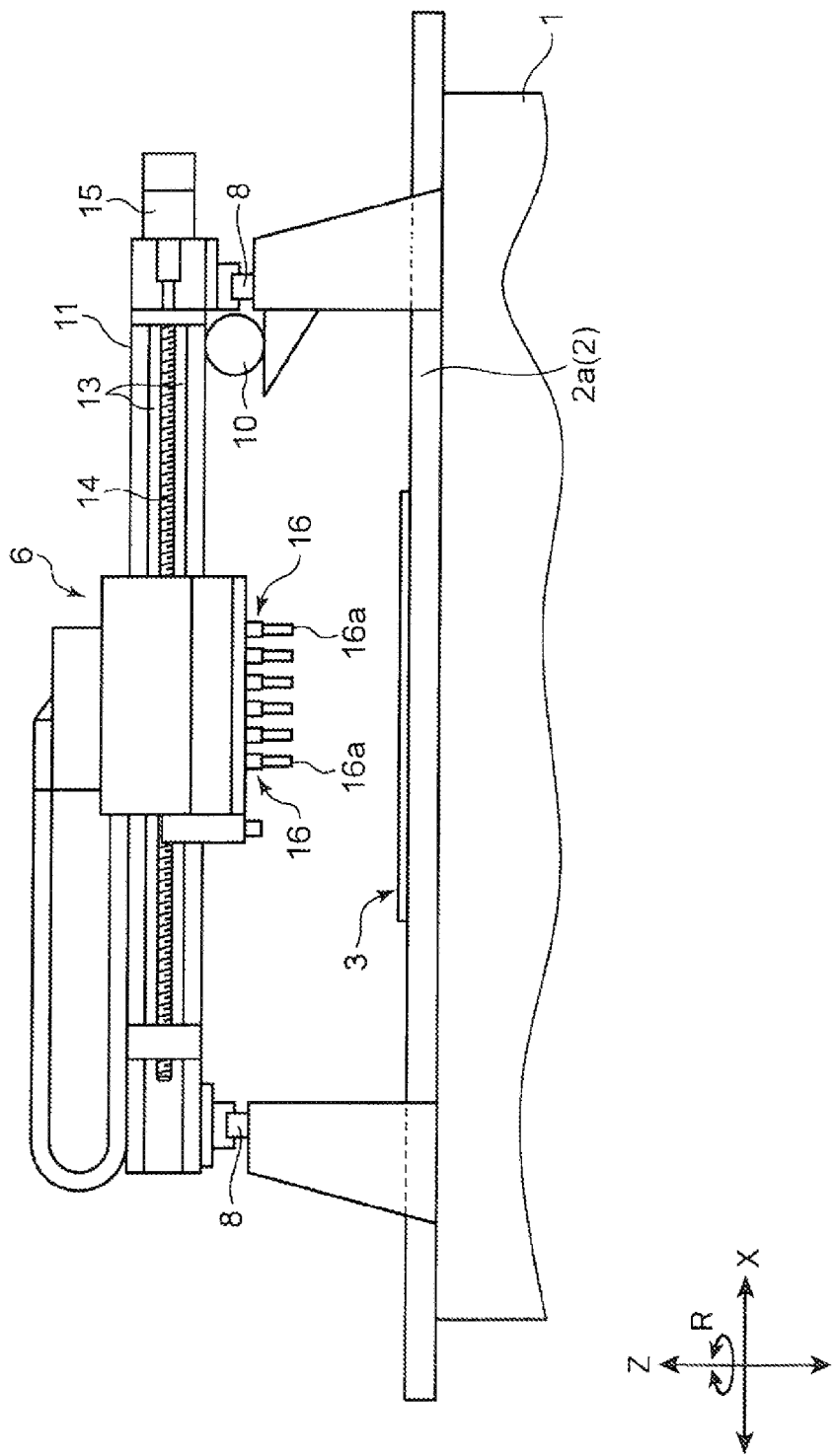
FIG. 2 is a front view schematically showing the component mounting device shown in FIG. 1.

FIGS. 1 and 2 each schematically show a component mounting device (a component mounting device to which a component imaging device of the present invention is applied) according to the present invention. FIG. 1 is a schematic plan view of the component mounting device, and FIG. 2 is a schematic front view of the component mounting device. Note that FIGS. 1 and 2 and subsequent diagrams each show an XYZ rectangular coordinate axes for clarifying the relationship among the directions in each diagram.

The component mounting device has a base 1, a board conveying mechanism 2 that is disposed on the base 1 and conveys a board 3, such as a printed wiring board (PWB), in an X direction, component feeders 4, 5, a component mounting head unit 6, a head unit drive mechanism for driving the head unit 6, an imaging unit 7 for recognizing components.

The board conveying mechanism 2 includes a pair of conveyors 2a for conveying the board 3 on the base 1. These conveyors 2a receive the board 3 from the right-hand side of each diagram, convey the board 3 to a predetermined mounting work position (the position shown in each diagram), and hold the board 3 using a holding device, not shown. After the mounting work, the conveyors 2a deliver the board 3 to the left-hand side of each diagram.

The component feeders 4, 5 are disposed on both sides of the board conveying mechanism 2 (either side of a Y direction). Of the component feeders 4, 5, the component feeder 4 has a plurality of tape feeders 4a disposed in the X direction along the board conveying mechanism 2. Each of the tape feeders 4a has a reel that is wrapped with a tape for storing/holding a small chip component, such as an IC, a transistor, or a capacitor. The tape is intermittently reeled out from the reel to feed the component to a predetermined component feeding position in the vicinity of the board conveying mechanism 2. The component feeder 5, on the other hand, has trays 5a, 5b that are set with a predetermined interval therebetween in the X direction. Package type components such as QFP (Quad Flat Package) and BGA (Ball Grid Array) are placed in a line in the respective trays 5a, 5b in a manner as to be removed with the head unit 6, which is described hereinafter.

The head unit 6 for removing the components from the component feeders 4, 5 and mounting the components on the board 3 is disposed above the board conveying mechanism 2 and the component feeders 4, 5.

The head unit 6 can be moved in the X direction and the Y direction within a certain region by the head unit drive mechanism. This head unit drive mechanism is fixed on a pair of elevated frames provided on the base 1, and includes a pair of fixing rails 8 extending parallel to each other in the Y direction, a unit support member 11 supported by the fixing rails 8 and extending in the X direction, and a ball screw shaft 9 that is screwed and inserted into the unit support member 11 and driven by a Y-axis servomotor 10. The head unit drive mechanism also includes a fixing rail 13 that is fixed to the unit support member 11 and supports the head unit 6 so as to be able to move the head unit 6 in the X direction, and a ball screw shaft 14 that is screwed and inserted into the head unit 6 and driven by an X-axis servomotor 15 serving as a drive source. In other words, the head unit drive mechanism moves the head unit 6 in the X direction by means of the ball screw shaft 14 driven by the X-axis servomotor 15, and moves the unit support member 11 in the Y direction by means of the ball screw shaft 9 driven by the Y-axis servomotor 10. As a result, the head unit 6 is moved in the X direction and the Y direction within the certain region.

The head unit 6 has a plurality of mounting heads 16 that have component absorbing nozzles 16a at tip ends thereof, and a head drive mechanism that has, as a drive source, a servomotor for lifting up and down (a movement in a Z direction) the mounting heads 16 with respect to the head unit 6 and rotating the mounting heads 16 around nozzle central axes (a rotation in a R direction in FIG. 2).

There are twelve mounting heads 16. Two rows, which are aligned front and back in a single line, of six mounting heads 16 are allocated in the Y direction, with each mounting head being aligned (in each row) in the X direction, and loaded in the head unit 6. Hereinafter, for explanatory convenience, the row of mounting heads 16 on the lower side of FIG. 1 (the forward (front) side of the component mounting device) is referred to as "front row," and the row of mounting heads 16 on the upper side of FIG. 1 (the rear side of the component mounting device) as "back row." Furthermore, the mounting heads 16 in the front row are called "front row heads 16," and the mounting heads 16 in the back row are called "back row heads 16."

In the present embodiment, the mounting heads 16 in the front row and the mounting heads 16 in the back row are aligned in the same positions in the X direction. However, the mounting heads 16 in the front row and the mounting heads 16 in the back row may be aligned alternately in the X direction.

The nozzle 16a of each of the mounting heads 16 can be communicated with a negative pressure generating device, a positive pressure generating device, or the atmosphere through the medium of electric switching valve. In other words, the nozzle 16a receives a supply of negative pressure and thereby absorb and hold the component. Subsequently, the nozzle 16a receives a supply of positive pressure and thereby release the component.

The imaging unit 7 captures images of the components removed from the component feeders 4, 5, before the components are mounted, in order to recognize, with the images, the state in which the components are held by the mounting heads 16. The imaging unit 7 is disposed above the base 1 and between the trays 5a, 5b.

Figure 3:
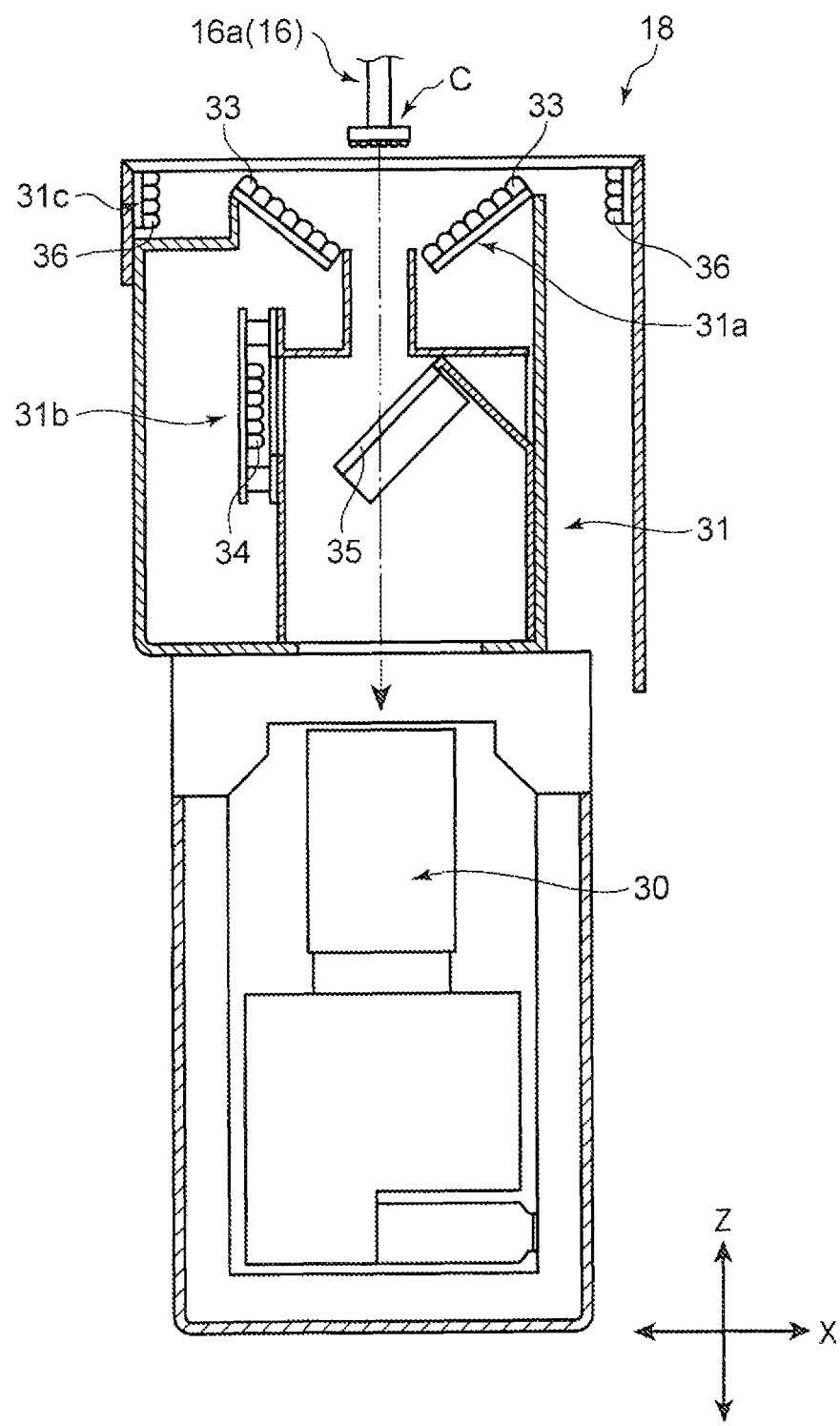
FIG. 3 is a cross-sectional view schematically showing an imaging unit loaded in the component mounting device shown in FIG. 1.

The imaging unit 7 is disposed fixedly on the base 1 and includes, as shown in FIG. 3, a camera 30 for capturing an image of the bottom of a component C held by the mounting head 16, a lighting device 31 for applying imaging light to the component C, and a lighting controller 32 (shown in FIG. 4) for controlling the lighting device 31.

The camera 30 has a line sensor with a row of a plurality of imaging elements, a lens, and the like. The imaging unit 7 is fixed on the base 1 such that the imaging elements line up in the Y direction. The line sensor performs an imaging operation for imaging a line image at a predetermined timing and outputs the obtained line image as image data for each imaging line. The number of elements of this line sensor (the length of light-receiving elements) is set in a manner as to be able to simultaneously capture images of the components that are held by any of the front row heads 16 and the back row heads 16 that are adjacent to each other in the Y direction. Therefore, by allowing the head unit 6 to pass the imaging unit 7 once in a direction (a sub-scanning direction; X direction) perpendicular to the direction in which the imaging elements are arranged (a main scanning direction), the images of the lower sides of the components held by the mounting heads 16 in the front row and the back row can be captured.

The lighting device 31 is disposed above the camera 30. This lighting device 31 has three types of lighting parts; a first lighting part 31a disposed in the middle of an upper end part of the lighting device 31, a second lighting part 31b disposed in an inner part of the lighting device 31, and a third lighting part 31c disposed in the upper end part of the lighting device 31, which is outside the first lighting part 31a.

The first lighting part 31a has an opening part in the center thereof, as shown in FIG. 3, and has a plurality of LEDs 33 on its inner surface having a flared funnel-shaped frame. The first lighting part 31a turns these LEDs 33 on to apply illumination light obliquely to the bottom of the component C positioned above the imaging unit 7.

The second lighting part 31b is disposed below the first lighting part 31a and includes a plurality of LEDs 34 lining up sideways and a half mirror 35. The second lighting part 31b causes light from the LEDs 34 to deflect 90° at the half mirror 35 and thereby applies illumination light to the component C above the imaging unit 7 from immediately below the component C, in a direction parallel to an optical axis of the camera 30.

The third lighting part 31c has a plurality of LEDs 36 that face inward in a manner as to surround the first lighting part 31a. The third lighting part 31c turns these LEDs 36 on to apply illumination light laterally to the component C positioned above the imaging unit 7.

Figure 4:
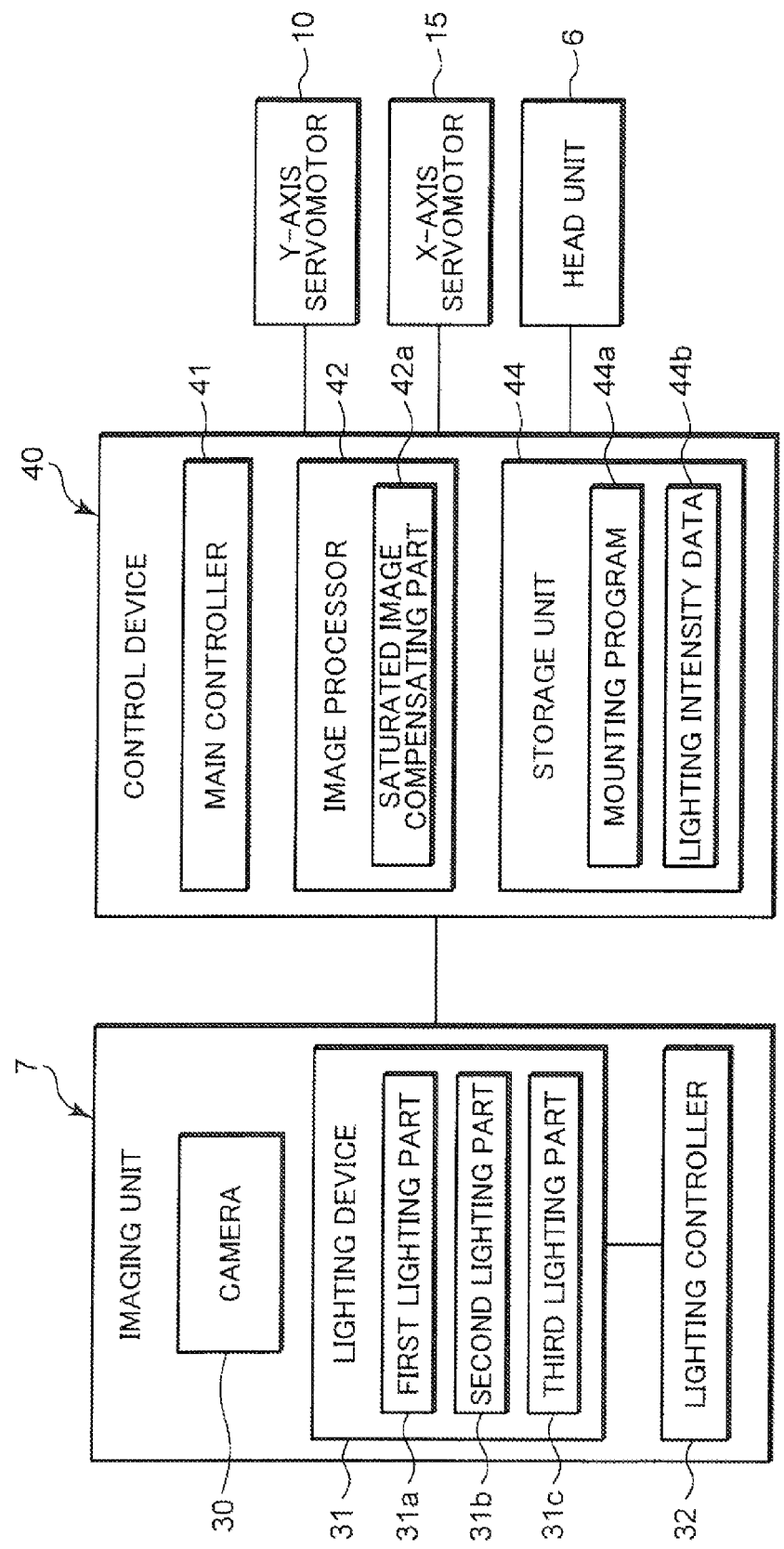
FIG. 4 is a block diagram showing an electric configuration of substantial parts of the component mounting device shown in FIG. 1.

Note that this component mounting device further has a control device 40 that integrally controls the operations of the component mounting device, as shown in FIG. 4. This control device 40 is configured by a CPU for executing logical computation, a ROM for storing various programs to control the CPU, a RAM for temporarily storing various data, an HDD, and the like. This control device 40 includes a main controller 41, an image processor 42, and a storage unit 44, as functional configurations.

The main controller 41 integrally controls the servomotors 10, 15, the head unit 6, the imaging unit 7 and the like in accordance with a mounting program 44a stored in the storage unit 44, and executes image recognition on the components held by the mounting heads 16 and various image processes and computation processes to perform the image recognition. Especially when executing component recognition, the main controller 41 selects a direction in which the light is applied to each component (i.e., selects a lighting part) when the imaging unit 7 captures an image of the component, and outputs a timing signal to the imaging unit 7 in order to control the timing at which the image is captured by the camera 30 and the timing at which the lighting device 31 is turned on. This signal is defined beforehand based on a moving speed at which the head unit 6 is moved with respect to the timing unit 7, so as to be output at constant time intervals, and the timing at which the signal is output is incorporated in the mounting program 44a.

Furthermore, when executing the component recognition, the main controller 41 outputs a control signal to the lighting controller 32 embedded in the imaging unit 7, so that the lighting intensity (luminous intensity) of the lighting device 31 is controlled based on a lighting intensity data 44b stored previously in the storage unit 44. The lighting intensity data 44b are data with a defined optimum lighting intensity at which a component image suitable for component recognition is obtained for each component (type) (i.e., a lighting intensity at which the component can be imaged with an optimum illuminance). When the main controller 41 outputs the data to the lighting controller 32, the lighting controller 32 controls the lighting intensity of the lighting device 31 based on the data. Changing a supply current value of a current supplied to the LEDs 33, 34, 36 or pulse width modulation (PWM) can be applied as a method for controlling the lighting intensity. The latter is used as the control method according to the present embodiment, in which the lighting controller 32 changes the lighting intensity by changing the times (pulse width) at which the LEDs 33, 34, 36 are turned on (see FIG. 6). In the present embodiment, the storage unit 44 corresponds to a lighting intensity data storage unit of the present invention.

As will be described later in detail, when the optimum lighting intensity of the components held by the mounting heads 16 of the front row is different from the optimum lighting intensity of the components held by the mounting heads 16 of the back row, the image processor 42 compensates, out of the component images captured by the camera 30, a line image that is captured at a lighting intensity other than the optimum lighting intensities. This image processor 42 includes a saturated image compensating part 42a. When the line image of the component images captured by the camera 30 includes a saturated pixel, the saturated image compensating part 42a compensates an image of the saturated pixel. An image compensating process performed by the image processor 42 (the saturated image compensating part 42a) is described hereinafter in detail.

Note that, in the present embodiment, the imaging unit 7, the head unit 6, the head unit drive mechanism, the control device 40 and the like each correspond to the component imaging device according to the present invention. Of these component imaging devices, the head unit 6 and the head unit drive mechanism each correspond to a moving device, and the main controller 41, the lighting controller 32 and the like correspond to an imaging controller according to the present invention. In addition, the head unit drive mechanism, the control device 40 and the like each correspond to a loading device according to the present invention.

Next are described a series of mounting operations performed based on the control of the control device 40 and a component recognition process for recognizing the components absorbed and held by the mounting heads 16.

In this component mounting device, first, the head unit 6 is moved on the component feeders 4, 5, whereby the components are absorbed and held by the mounting heads 16. After absorbing the components, the head unit 6 passes above the imaging unit 7, or, in other words, the head unit 6 passes above the imaging unit 7 once in the X direction. As a result, the components that are held by the mounting heads 16 of the front and back rows are imaged by the imaging unit 7, and an absorption state of the components held by the mounting heads 16 of each row are recognized based on these images. When there is a defective component or an uncorrectable absorption state in these components held by the mounting heads 16, such a component is registered as a component to be discarded. Thereafter, the head unit 6 is moved on the board 3, and consequently the components other than the component to be discarded are sequentially mounted on the board 3. At this moment, the components are mounted appropriately in loading points on the board 3 by controlling the position of the head unit 6 and a rotation angle of the mounting heads 16 on the basis of a result of the abovementioned component recognition.

Once the components are mounted on the board 3 as described above, the head unit 6 is moved on a component discard box, not shown, and the component to be discarded are discarded. In this manner, one cycle of the mounting operation ends. Desired components can be mounted on the board 3 by repeating the operations according to need.

Figure 5:
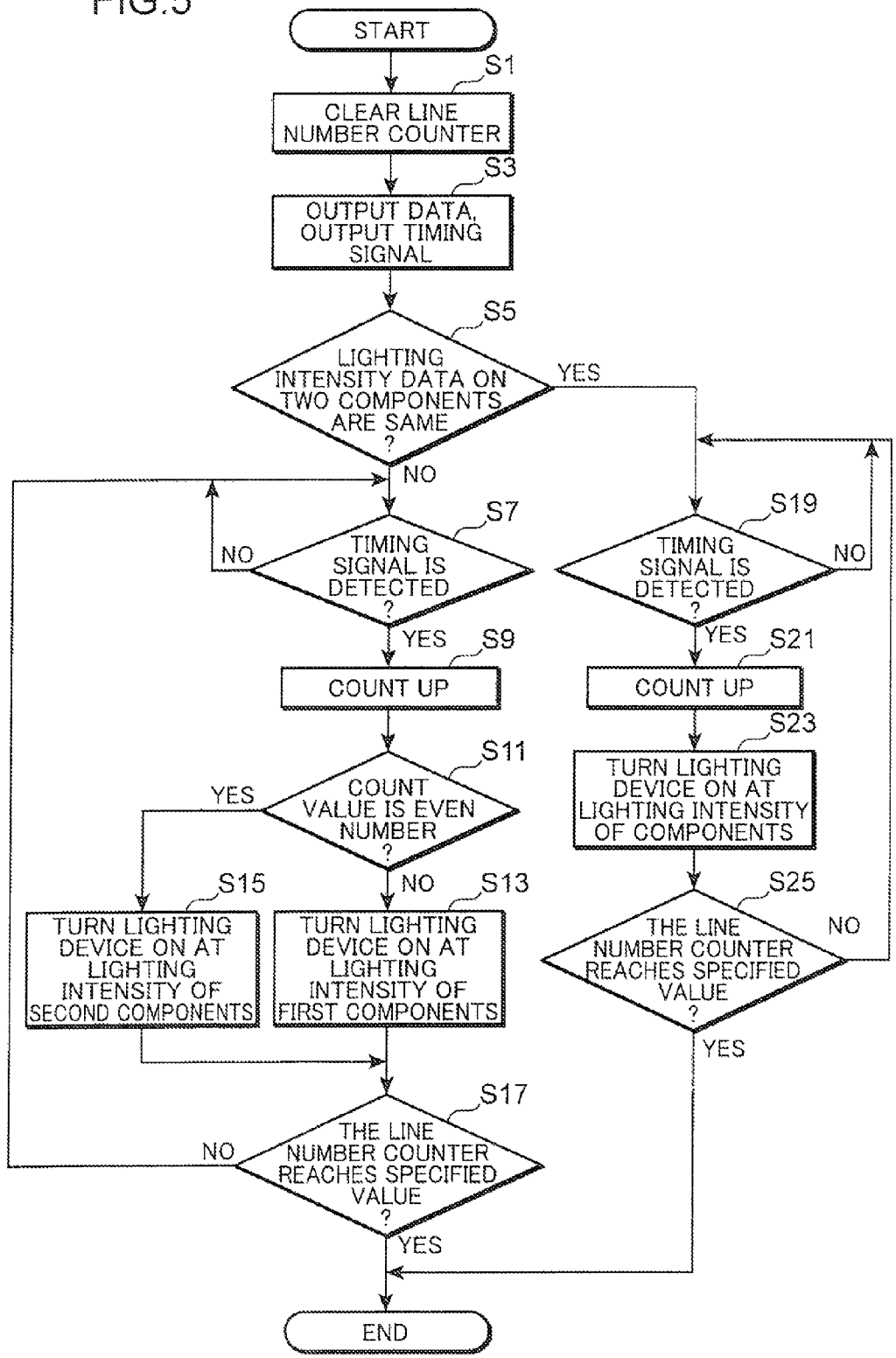
FIG. 5 is a flowchart showing the control of the imaging unit at the time of component recognition.

FIG. 5 is a flowchart showing the control of the camera 30 and the lighting device 31 in the component mounting operations. Note here that the components held by the front row heads 16 have the same optimum lighting intensity, and the component held by the back row heads 16 also have the same optimum lighting intensity.

Once the components are absorbed by the mounting heads 16, the lighting controller 32 clears a line number counter embedded therein (step S1). The main controller 41 reads the lighting intensity data 44b of the components held by the front and back mounting heads 16, outputs the read lighting intensity data 44b to the imaging unit 7, and starts outputting the timing signal to the imaging unit 7 (step S3).

Subsequently, based on the lighting intensity data 44b, the lighting controller 32 determines whether or not the lighting intensities of two components are the same, or whether the optimum lighting intensity of the components held by the front row heads 16 is same as the optimum lighting intensity of the components held by the back row heads 16 (step S5). When the optimum lighting intensities of the two components are the same (YES in step S5), the lighting controller 32 counts up (increments) the line number counter while waiting for the timing signal to be detected, and then turns the lighting device 31 on (steps S19 to S23). More specifically, the lighting device 31 is turned on for a time period corresponding to the lighting intensity data 44b. The camera 30 carries out imaging scan in synchronization with the timing signal. Consequently, the camera 30 acquires an image corresponding to one imaging line at a lighting intensity suitable for the components held in each row.

Next, the lighting controller 32 determines whether or not the line number counter reaches a specified value (step S25), or whether or not all of the components held by the mounting heads 16 of the front and back rows pass above the camera 30. When the result of this determination is NO, the process proceeds to step S19. Consequently, imaging of the components is continued. However, when the result of this determination is YES, the lighting controller 32 outputs an end signal to the main controller 41, and the main controller 41 stops outputting the timing signal, in response to the input of the end signal. As a result, a component imaging operation by the imaging unit 7 is ended.

When, on the other hand, the result of step S5 is NO, or when it is determined that the lighting intensity of the components held by the front row heads 16 is not the same as the optimum lighting intensity of the components held by the back row heads 16 (NO in step S5), the lighting controller 32 counts up (increments) the line number counter while waiting for the timing signal to be detected (steps S7, S9), and then determines whether the counter value is an even number or not (step S11).

When the result of this determination is NO, the lighting controller 32 turns the lighting device 31 on for a time period corresponding to the lighting intensity data 44b of the components held by the front row heads 16 (referred to as "first components" hereinafter) of the mounting heads 16. The camera 30 carries out imaging scan in synchronization with the timing signal. Consequently, the camera 30 acquires an image corresponding to one imaging line at a lighting intensity suitable for the first components. However, when the result of step S11 is YES, the lighting controller 32 turns the lighting device 31 on for a time period corresponding to the lighting intensity data 44b of the components held by the back row heads 16 (referred to as "second components" hereinafter) of the mounting heads 16. Consequently, the camera 30 acquires an image corresponding to one imaging line at a lighting intensity suitable for the second components.

Next, the lighting controller 32 determines whether or not the line number counter reaches the specified value, or whether or not all of the components held by the mounting heads 16 of the front and back rows pass above the camera 30 (step S17). When the result of this determination is NO, the process proceeds to step S7. Consequently, imaging of the components is continued. However, when the result of this determination is YES, the lighting controller 32 outputs an end signal to the main controller 41, and the main controller 41 stops outputting the timing signal, in response to the input of the end signal. As a result, the component imaging operation by the imaging unit 7 is ended.

Figure 6A:
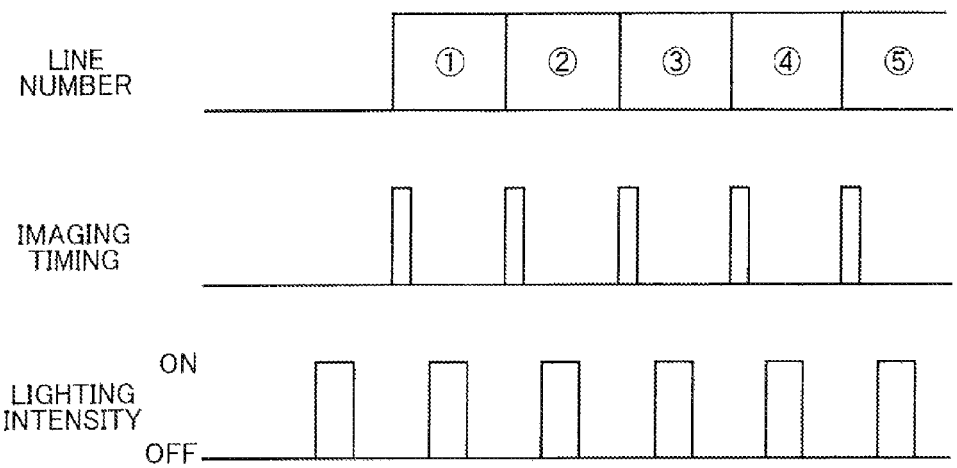
FIG. 6A is a timing chart showing a changing timing for changing lighting intensities and an imaging timing of the imaging unit, wherein an optimum lighting intensity of a first component is the same as an optimum lighting intensity of a second component.
Figure 6B:
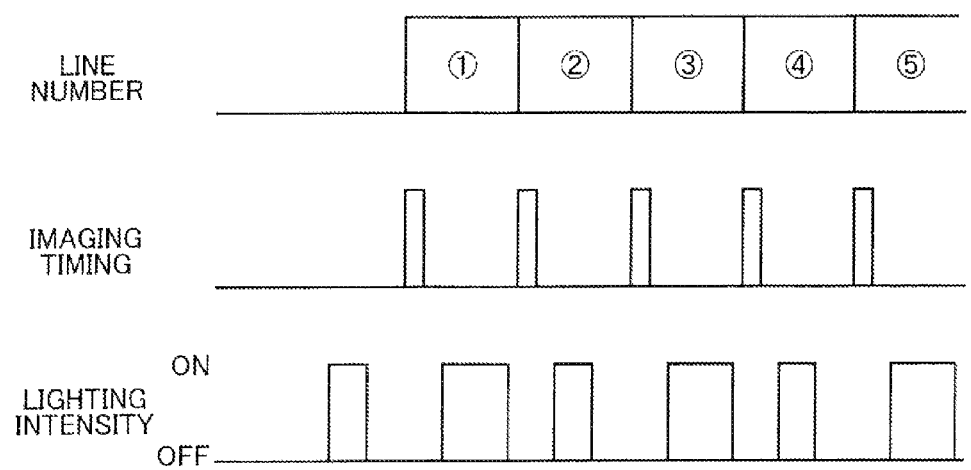
FIG. 6B is a timing chart showing a changing timing for changing lighting intensities and an imaging timing of the imaging unit, wherein the optimum lighting intensities of the first and second components are different from each other.

FIG. 6 is a timing chart of the imaging operation of the imaging unit 7 based on the above-described control performed by the main controller 41 and the lighting controller 32. In addition, the line image of each line (numbers with a circle in FIG. 6) is captured with the camera 30 to predetermined timing, after the lighting device 31 is turned on only during the predetermined setting. At this point, when the lighting intensity data of the first components are same as the lighting intensity data of the second components, as shown in FIG. 6A, the camera 30 images the components, one imaging line by one imaging line, in synchronization with the timing signal, with the lighting device 31 being turned on at a lighting intensity common to all lines. On the other hand, when the lighting intensity data of the first components are different than the lighting intensity data of the second components, as shown in FIG. 6B, the camera 30 captures the images of the components, one imaging line by one imaging line, with the lighting device 31 being turned on at a lighting intensity that varies alternately with respect to each of the imaged lines, or while alternately switching the lighting intensity of the lighting device 31 between the optimum lighting intensity of the first components (referred to as "first lighting intensity" hereinafter) and the optimum lighting intensity of the second components (referred to as "second lighting intensity" hereinafter).

The image data of the components that are captured by the imaging unit 7 as described above are output from the camera 30 to the image processor 42. The image processor 42 performs a predetermined image process on the image data, and the main controller 41 recognizes the components based on the image.

Figure 7A:
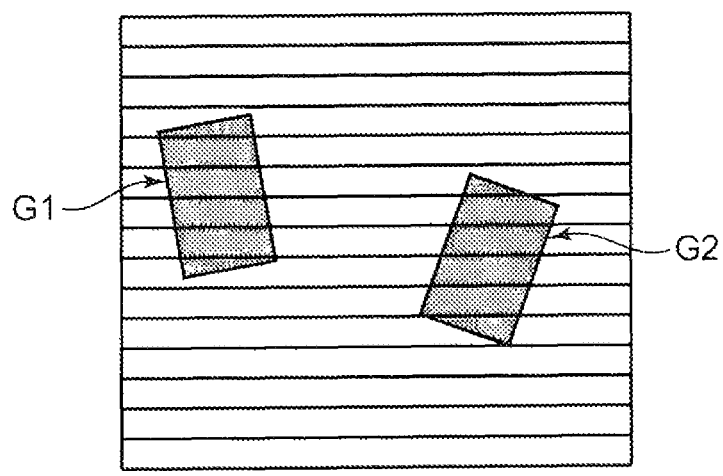
FIG. 7A is a schematic diagram of a component image of each component, wherein the optimum lighting intensities of the first and second components are equal to each other.
Figure 7B:
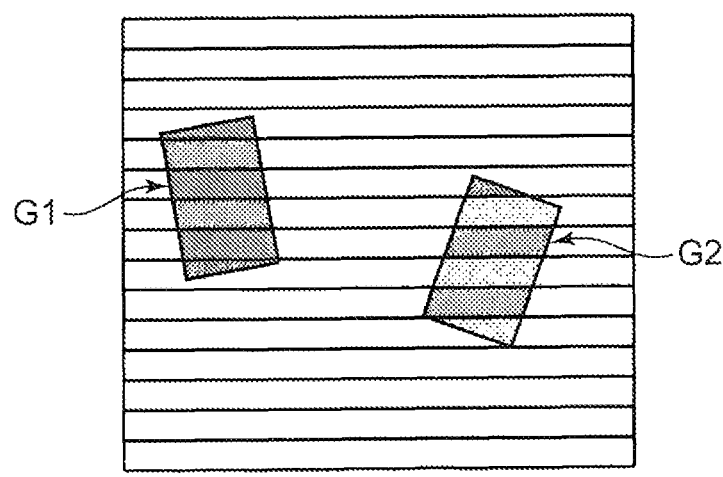
FIG. 7B is a schematic diagram of the component image of each component, wherein the optimum lighting intensities of the first and second components are different from each other.

Here, when the lighting intensity data of the first components are same as the lighting intensity data of the second components, the lighting intensity of the lighting device 31 is controlled as shown in FIG. 6A. As a result, as shown in FIG. 7A, for example, a component image G1 corresponding to the first components and a component image G2 corresponding to the second components become images obtained by imaging the entire components at an appropriate intensity. However, when the lighting intensity data of the first components are different than the lighting intensity data of the second components, the lighting intensity of the lighting device 31 is controlled as shown in FIG. 6B. As a result, as shown in FIG. 7B, for example, the component image G1 corresponding to the first components and the component image G2 corresponding to the second components become images in each of which a line image captured at an appropriate lighting intensity and a line image captured at an inappropriate lighting intensity are arranged alternately.

Therefore, when the components are imaged by controlling the lighting device 31 shown in FIG. 6B (the processes of steps S7 to S17 shown in FIG. 5), the image processor 42 compensates for the line image being captured at the second lighting intensity of the component image G1 corresponding to the first components, on the basis of a ratio of the second lighting intensity and the first lighting intensity, and compensates for the line image being captured at the first lighting intensity of the component image G2 corresponding to the second components, on the basis of a ratio of the first lighting intensity and the second lighting intensity.

Specifically, for the odd-numbered imaging lines, the imaging unit 7 is controlled to image the components at the first lighting intensity. For the even-numbered imaging lines, the imaging unit 7 is controlled to image the components at the second lighting intensity (see steps S11 to S15 in FIG. 5). For this reason, the image processor 42 compensates the even-numbered line images of the component image G1 corresponding to the first components, the even-numbered line images being captured at an inappropriate lighting intensity, and compensates the odd-numbered line images of the component image G2 corresponding to the second components, the odd-numbered line images being captured at an inappropriate lighting intensity. For instance, as shown in FIG. 8, when the optimum lighting intensity of the first components is "4" and the optimum lighting intensity of the second components is "6," the image processor 42 compensates the image data of the pixels of the even-numbered line images of the component image G1 corresponding to the first components at a ratio of the first lighting intensity to the second lighting intensity. In other words, the image processor 42 reduces the image data of the even-numbered line image by multiplying the image data by a coefficient 2/3. For the component image G2 corresponding to the second components, on the other hand, the image processor 42 compensates the image data of the pixels of the odd-numbered line image of the component image G2 at a ratio of the second lighting intensity to the first lighting intensity. In other words, the image processor 42 increases the image data of the odd-numbered line images by multiplying the image data by a coefficient 3/2. In this manner, the image processor 42 compensates the component images G1, G2 of the first and second components to images that are equivalent to the component images shown in FIG. 7A.

When the optimum lighting intensity of the first components is "4" and the optimum lighting intensity of the second components is "6" as described above, the even-numbered line images of the component image G1 of the first components that are captured at the lighting intensity ("6") higher than the optimum lighting intensity ("4") include a so-called saturated pixel. In other words, the light-receiving elements become saturated because the light reception level of the even-numbered line image exceeds an upper limit value, generating pixels that turn the image to white. Therefore, the image processor 42 determines the presence/absence of a saturated pixel on the basis of the component image G1 corresponding to the first components, and when there exists a saturated pixel, the saturated image compensating part 42a performs the compensating process on the image having the saturated pixel.

Specifically, as shown in FIG. 9, when, for example, a saturated pixel exists in a second line image (2), which is an even-numbered line image, the saturated image compensating part 42a obtains, as the image data of the saturated pixel, an average value of the image data of pixels 51 to 53 and 61 to 63, which are adjacent to the saturated pixel among the pixels of a first line image (1) and a third line image (3) that are adjacent to the second line image (2), the first and third line images being line images captured at the optimum lighting intensity. This prevents the generation of a so-called white spot caused by the saturated pixel in the component image G1 of the first components.

As described above, in this component mounting device, the imaging unit 7 can perform imaging and image recognition on the first component held by the front row heads 16 and the second component held by the back row heads 16, the first and second component having different optimum lighting intensities. Particularly, in this component mounting device, the camera 30 captures the images of the components, one imaging line by one imaging line, while alternately switching the lighting intensity of the lighting device 31 between the optimum lighting intensity (the first lighting intensity) of the first components and the optimum lighting intensity (the second lighting intensity) of the second components. However, unlike the prior art (the technology of the patent literature), the component mounting device according to the present embodiment does not extract, from the image and for each component, the line images captured at the optimum lighting intensity and synthesize the line images, but compensates the line image of the image of each component, which is captured at the lighting intensity other than the optimum lighting intensity, in accordance with the ratio of this lighting intensity and the optimum lighting intensity. Therefore, unlike the prior art (the technology of the patent literature), the component mounting device according to the present embodiment can acquire the component images that are equivalent to the ones captured entirely at the optimum lighting intensity, as the component images of the first components and the second components, without lowering the moving speed of the components moving relative to the line sensor (lowering the speed more than when the lighting intensity is not switched) in order to acquire the component images.

Therefore, according to this component mounting device, the first components and the second components having different optimum lighting intensities can be imaged and recognized efficiently by the imaging unit 7, whereby the work of mounting the components onto the board 3 can be performed efficiently.

Furthermore, in this component mounting device, when the line image include a saturated pixel, the image data of the saturated pixel are compensated based on a line image adjacent to this line image, which is a line image captured at the optimum lighting intensity. Therefore, images equivalent to the images captured at the optimum lighting intensity can be acquired, even when the saturated pixels is generated. Consequently, even when a saturated pixel is easily generated due to a relatively large difference in lighting intensity between the first components and the second components, favorable component images can be acquired without significantly damaging the image quality.

Incidentally, the component mounting device described above is an example of a preferred embodiment of the component mounting device according to the present invention (the component mounting device to which the component mounting device according to the present invention is applied, and the component mounting device in which the component imaging method according to the present invention is used), and the specific configurations and the like thereof can be changed appropriately within the scope of the present invention.

For example, in the embodiment described above, the saturated image compensating part 42a is configured to obtain, as the image data of a saturated pixel, an average value of the image data of pixels (the pixels 51 to 53 and 61 to 63) that are adjacent to the saturated pixel among the pixels of the line images (the first and third line images (1) and (3)) adjacent to the line image with the saturated pixel (the second line image (2)), and thereby compensate the image of the saturated pixel. However, the saturated image compensating part 42a may be configured to obtain, for example, as the image data of the saturated pixel, an average value of intermediate values of the image data of the pixels (the pixels 51 to 53 in the example shown in FIG. 9) that are adjacent to the saturated pixel among the pixels of a line image adjacent to one side of the line image with the saturated pixel, and intermediate values of the image data of the pixels (the pixels 61 to 63 in the example shown in FIG. 9) that are adjacent to the saturated pixel among the pixels of the line image adjacent to the other side of the line image with the saturated pixel, and thereby compensate the image of the saturated pixel. In short, the saturated image compensating part 42a may be configured to compensate the image of the saturated pixel, based on the image data of the line images positioned on either side of the line image with the saturated pixel, the line images being captured at the optimum lighting intensity of the components of the component images.

The embodiment described above (FIG. 5) is based on the case in which the lighting intensity data of the component held by the front row heads 16 (the first components) are all the same and in which the lighting intensity data of the component held by the back row heads 16 (the second components) are all the same, when the main controller 41 and the lighting controller 32 control the imaging unit 7. However, the embodiment may not be limited thereto. In such a case, while the head unit 6 passes above the imaging unit 7 under the control of the main controller 41 and the lighting controller 32, the components may be imaged and recognized based on the processes of steps S5 to S27 in FIG. 5 for each of the components held by each pair of heads of the front row heads 16 and the back row heads 16, which are adjacent to each other in the Y direction.

Moreover, in the embodiment described above, the imaging unit 7 is fixedly disposed on the base 1, and the head unit 6 is moved above the imaging unit 7, so the components held by the mounting heads 16 are imaged by the imaging unit 7. However, in addition to such a configuration, the present invention may have a configuration in which an imaging unit is loaded in the head unit 6 and the imaging unit is moved in the X direction relative to the head unit 6 so that the components held by the mounting heads 16 are imaged by the imaging unit.

In addition, this embodiment has described the component mounting device according to the present invention. However, the component imaging device (the component imaging method) according to the present invention, which is applied to the component mounting device, can be applied to, not only the component mounting device, but also, for example, a component test device that uses a head to absorb a component fed from a component feeder and hold the component, uses an imaging unit to image/recognize an absorption state of the component, and then delivers the component to a predetermined test part to perform a current application test on the component.

A summary of the present invention described above is as follows.

A component imaging method according to one aspect of the present invention is a component imaging method for simultaneously imaging a plurality of components that have different optimum lighting intensities for component imaging, the component imaging method including: an imaging preparation step of obtaining, for each of the plurality of components, an optimum lighting intensity at which a component image, eligible for component recognition, can be obtained; a component imaging step of using a line sensor and a lighting device that image a line image at a predetermined timing and output the obtained line image as an image for each imaging line, to integrally move the plurality of components in a sub-scanning direction of the line sensor relative to this line sensor, with the plurality of components being aligned in a main scanning direction of the line sensor, and to acquire images of the plurality of components while switching a lighting intensity of the lighting device sequentially to the optimum lighting intensity of each of the components for each imaging line during the relative movement; and an image processing step of compensating a line image, which is imaged at a lighting intensity other than the optimum lighting intensities, on the basis of a ratio of the lighting intensity at which the line image is obtained and the optimum lighting intensity of each of the plurality of components of the obtained component images, for the component image of each of the plurality of components.

The component imaging method according to this aspect acquires the images while switching the lighting intensity of the lighting device sequentially to the optimum lighting intensity of each of the components for each imaging line. However, unlike the technology of the patent literature, the component imaging method does not extract, from the images, the line images of the components imaged at the optimum lighting intensities and synthesize the line images, but compensates the line image of the image of each component, which is imaged at the lighting intensity other than the optimum lighting intensities, in accordance with the ratio of this lighting intensity and the optimum lighting intensities. Therefore, unlike the technology of the patent literature, the component imaging method can acquire the component images that are equivalent to the ones imaged entirely at the optimum lighting intensities, as the component images of the plurality of components, without lowering the moving speed of the components moving relative to the line sensor (lowering the speed more than when the lighting intensity is not switched).

Note that, in this method, when a large difference in optimum lighting intensity is included in the plurality of components, a so-called saturated pixel is generated in the image of the component having a weak optimum lighting intensity.

Therefore, compensating the image having the saturated pixel on the basis of the abovementioned ratio is not enough to keep the image quality. However, such inconvenience can be resolved by modifying the component imaging method of the aspect as follows.

In other words, in the image processing step, when the line image of the component images that is imaged at the lighting intensity other than the optimum lighting intensities includes a saturated pixel, instead of compensating an image of the saturated pixel on the basis of the ratio, the image of the saturated pixel is compensated on the basis of a line image of the component images that is imaged at the optimum lighting intensities and that is proximate to the line image having the saturated pixel.

According to this method, because the image of the saturated pixel is compensated based on the line image captured at the optimum lighting intensities is compensated, the image of the saturated pixel to an image equivalent to the one with no saturated pixels. Therefore, even when a saturated pixel is easily generated due to a large difference in optimum lighting intensity between the plurality of components, component images can be acquired without significantly damaging the image quality.

A component imaging device according to another aspect of the present invention has: a line sensor that images a line image at a predetermined timing and outputs the obtained line image as an image for each imaging line; a moving device that integrally moves a plurality of components having different optimum lighting intensities in a sub-scanning direction of the line sensor relative to this line sensor, with the plurality of components being aligned in a main scanning direction of the line sensor; a lighting device that illuminates the components moved by the moving device; a lighting intensity data storage unit that stores data of lighting intensity of each of the plurality of components and lighting intensity eligible for component recognition of each of the plurality of components; an imaging controller that controls a scan timing of the line sensor such that images of the plurality of components are imported while switching a lighting intensity of the lighting device sequentially to the optimum lighting intensity of each of the components for each imaging line during the relative movement, and controls the lighting intensity of the lighting device based on the optimum lighting intensity data stored in the lighting intensity data storage unit; and an image processor that, for component images of the plurality of components imaged by the line sensor, compensates image data of a line image that is imaged at a lighting intensity other than the optimum lighting intensities, based on a ratio of the lighting intensity at which the line image is imaged and the optimum lighting intensity of each of the components of the component images.

According to this component imaging device, during the movement of the plurality of components relative to the line sensor, the imaging controller controls the line sensor and the lighting device such that the images of the plurality of components are acquired by switching the lighting intensity of the lighting device sequentially to the optimum lighting intensity of each component, for each imaging line. Furthermore, the image processor compensates, out of the component images of the components, the image data of the line image captured at the lighting intensity other than the optimum lighting intensities, on the basis of the ratio. Therefore, the component imaging device can automatically image the components in accordance with the component imaging method described above.

In this component imaging device, the image processor includes a saturated image compensating part that, when the line image of the component images that is imaged at the lighting intensity other than the optimum lighting intensities includes a saturated pixel, compensates image data of the saturated pixels, wherein the saturated image compensating part compensates the image data of the saturated pixel based on image data of line images that are positioned on both sides of the line image including the saturated pixel and imaged at the optimum lighting intensities of the components of the component images.

According to this component imaging device, when a saturated pixel is generated in any of the component images, the saturated image compensating part compensates the image data of the saturated pixel based on the image data of the line images imaged at the optimum lighting intensities. As a result, the image of the saturated pixel can be compensated to an image equivalent to the one with no saturated pixels. Therefore, even when a saturated pixels is easily generated due to a large difference in optimum lighting intensity between the plurality of components, the component images of the components can be acquired without significantly damaging the image quality.

In such a component imaging device for imaging first components and second components having optimum lighting intensities higher than those of the first components, as the plurality of components, the lighting intensity data storage unit stores, as the optimum lighting intensity data, a first lighting intensity eligible to recognize the first components and a second lighting intensity eligible to recognize the second components, the imaging controller controls the scan timing of the line sensor and the lighting intensity of the lighting device so that the first components and the second components are imaged by switching the lighting intensity of the lighting device alternately to the first lighting intensity and the second lighting intensity, for each imaging line, the image processor compensates image data of a line image of component images of the first components, which is imaged at the second lighting intensity, by using a ratio of the first lighting intensity to the second lighting intensity, and compensates image data of a line image of component images of the second components, which imaged at the first lighting intensity, by using a ratio of the second lighting intensity to the first lighting intensity, and, when the line image of the component images of the first components that is imaged at the second lighting intensity includes a saturated pixel, the saturated image compensating part compensates image data of the saturated pixel based on image data of a pixel adjacent to the saturated pixel in pixels of a line image adjacent to the line image.

This component imaging device can acquire component images, as the component images of both first and second components, which are equivalent to those imaged entirely at the optimum lighting intensities, simply by allowing the first and second components to pass once with respect to the line sensor. Moreover, even when a saturated pixel is easily generated due to a relatively large difference in optimum lighting intensity between the first and second components, the component images of the components can be acquired without significantly damaging the image quality.

In this component imaging device, the saturated image compensating part preferably obtains, as the image data of the saturated pixel, an average value of image data of pixels adjacent to the saturated pixels in the pixels of the line image adjacent to the line image having the saturated pixel, or obtains, as the image data of the saturated pixel, an average value of an intermediate value of image data of a plurality of pixels adjacent to the saturated pixel in pixels of a line image adjacent to one side of the line image having the saturated pixel, and an intermediate value of image data of a plurality of pixels adjacent to the saturated pixel in pixels of a line image adjacent to the other side of the line image having the saturated pixel.

According to these configurations, the image of the saturated pixel can be compensated to an image equivalent to those imaged at the optimum lighting intensities.

In addition, a component mounting device according to another aspect of the present invention has: a plurality of mounting heads that are arranged in a specific direction and capable of holding components; any one of the component imaging devices described above; and a loading device that recognizes a state in which the components are held by the plurality of mounting heads, based on image data of the components held by the mounting heads and imaged by the component imaging device, and loads the components on a board by means of the mounting heads, wherein the moving device of the component imaging device integrally moves the plurality of mounting heads in a sub-scanning direction of the line sensor relative to this line sensor, with the plurality of mounting heads being aligned in a main scanning direction of the line sensor, and wherein the loading device loads the components on the board by moving the plurality of mounting heads relative to the board.

According to this component mounting device, the component held by the plurality of mounting heads are moved once relative to the line sensor, with the components aligned in the main scanning direction of the line sensor of the component imaging device. As a result, component images equivalent to those imaged entirely at the optimum lighting intensities can be acquired as the component images of the components. Then, after the state in which the components are held is recognized based on the image data, the components are loaded on the board.

What is claimed is:

1. A component imaging method for simultaneously imaging a plurality of components that have different optimum lighting intensities for component imaging, the component imaging method comprising:

an imaging preparation step of obtaining, for each of the plurality of components, an optimum lighting intensity at which a component image, eligible for component recognition, can be obtained;

a component imaging step of using a line sensor that image a line image at a predetermined timing and output the obtained line image as an image for each imaging line and a lighting device, to integrally move the plurality of components in a sub-scanning direction of the line sensor relative to this line sensor, with the plurality of components being aligned in a main scanning direction of the line sensor, and to acquire images of the plurality of components while switching a lighting intensity of the lighting device sequentially to the optimum lighting intensity of each of the components for each imaging line during the relative movement; and an image processing step of compensating a line image, which is imaged at a lighting intensity other than the optimum lighting intensities, on the basis of a ratio of the lighting intensity at which the line image is obtained and the optimum lighting intensity of each of the plurality of components of the obtained component images, for the component image of each of the plurality of components.

2. The component imaging method according to claim 1, wherein in the image processing step, when the line image of the component images that is imaged at the lighting intensity other than the optimum lighting intensities includes a saturated pixel, instead of compensating an image of the saturated pixel on the basis of the ratio, the image of the saturated pixel is compensated on the basis of a line image of the component images that is imaged at the optimum lighting intensities and that is proximate to the line image having the saturated pixel.

3. A component imaging device, comprising:

a line sensor that images a line image at a predetermined timing and outputs the obtained line image as an image for each imaging line;

a moving device that integrally moves a plurality of components having different optimum lighting intensities in a sub-scanning direction of the line sensor relative to this line sensor, with the plurality of components being aligned in a main scanning direction of the line sensor;

a lighting device that illuminates the components moved by the moving device;

a lighting intensity data storage unit that stores data of lighting intensity of each of the plurality of components and lighting intensity eligible for component recognition of each of the plurality of components;

an imaging controller that controls a scan timing of the line sensor such that images of the plurality of components are imported while switching a lighting intensity of the lighting device sequentially to the optimum lighting intensity of each of the components for each imaging line during the relative movement, and controls the lighting intensity of the lighting device based on the optimum lighting intensity data stored in the lighting intensity data storage unit; and an image processor that, for component images of the plurality of components imaged by the line sensor, compensates image data of a line image that is imaged at a lighting intensity other than the optimum lighting intensities, based on a ratio of the lighting intensity at which the line image is imaged and the optimum lighting intensity of each of the components of the component images.

4. The component imaging device according to claim 3, wherein the image processor includes a saturated image compensating part that, when the line image of the component images that is imaged at the lighting intensity other than the optimum lighting intensities includes a saturated pixel, compensates image data of the saturated pixels, and wherein the saturated image compensating part compensates the image data of the saturated pixel based on image data of line images that are positioned on both sides of the line image including the saturated pixel and imaged at the optimum lighting intensities of the components of the component images.

5. The component imaging device according to claim 4, wherein the component imaging device images, as the plurality of components, first components and second components having optimum lighting intensities higher than those of the first components, the lighting intensity data storage unit stores, as the optimum lighting intensity data, a first lighting intensity eligible to recognize the first components and a second lighting intensity eligible to recognize the second components, the imaging controller controls the scan timing of the line sensor and the lighting intensity of the lighting device so that the first components and the second components are imaged by switching the lighting intensity of the lighting device alternately to the first lighting intensity and the second lighting intensity, for each imaging line, the image processor compensates image data of a line image of component images of the first components, which is imaged at the second lighting intensity, by using a ratio of the first lighting intensity to the second lighting intensity, and compensates image data of a line image of component images of the second components, which imaged at the first lighting intensity, by using a ratio of the second lighting intensity to the first lighting intensity, and, when the line image of the component images of the first components that is imaged at the second lighting intensity includes a saturated pixel, the saturated image compensating part compensates image data of the saturated pixel based on image data of a pixel adjacent to the saturated pixel in pixels of a line image adjacent to the line image.

6. The component imaging device according to claim 5, wherein the saturated image compensating part obtains, as the image data of the saturated pixel, an average value of image data of pixels adjacent to the saturated pixels in the pixels of the line image adjacent to the line image having the saturated pixel.

7. The component imaging device according to claim 5, wherein the saturated image compensating part obtains, as the image data of the saturated pixel, an average value of an intermediate value of image data of a plurality of pixels adjacent to the saturated pixel in pixels of a line image adjacent to one side of the line image having the saturated pixel, and an intermediate value of image data of a plurality of pixels adjacent to the saturated pixel in pixels of a line image adjacent to the other side of the line image having the saturated pixel.

8. A component mounting device, comprising:
a plurality of mounting heads that are arranged in a specific direction and capable of holding components;
the component imaging devices described in claim 3; and
a loading device that recognizes a state in which the components are held by the plurality of mounting heads, based on image data of the components held by the mounting heads and imaged by the component imaging device, and loads the components on a board by means of the mounting heads, wherein
the moving device of the component imaging device integrally moves the plurality of mounting heads in a sub-scanning direction of the line sensor relative to this line sensor, with the plurality of mounting heads being aligned in a main scanning direction of the line sensor, and wherein
the loading device loads the components on the board by moving the plurality of mounting heads relative to the board.

* * * * *